US011366393B2

(12) United States Patent
Anselm et al.

(10) Patent No.: US 11,366,393 B2
(45) Date of Patent: Jun. 21, 2022

(54) SUPPORT OF AN OPTICAL ELEMENT (71) Applicant: Carl Zeiss SMT GmbH, Oberkochen (DE)

(72) Inventors: Eugen Anselm, Aalen (DE); Karl Fenkl, Illertissen (DE); Christoph Müller, Unterschneidheim (DE); Ralf Moser, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/780,446

(22) Filed: Feb. 3, 2020

(65) Prior Publication Data
US 2020/0249577 A1 Aug. 6, 2020

(30) Foreign Application Priority Data

Feb. 6, 2019 (DE) .......................... 102019201509.3

(51) Int. Cl.
*G03F 7/20* (2006.01)

(52) U.S. Cl.
CPC ........ *G03F 7/70033* (2013.01); *G03F 7/2004* (2013.01); *G03F 7/7015* (2013.01); *G03F 7/70258* (2013.01); *G03F 7/70316* (2013.01)

(58) Field of Classification Search
CPC .............. G03F 7/70033; G03F 7/7015; G03F 7/70316; G03F 7/70258; G03F 7/2004; G03F 7/70825; G03F 7/70833; G02B 7/021; G02B 7/182; G02B 7/02; G02B 7/022; G02B 7/1827; G02B 7/003; G02B 27/646; G02B 7/026; G02B 7/023; G01B 5/20

See application file for complete search history.

(56) References Cited

U.S. PATENT DOCUMENTS

| 5,822,133 A | 10/1998 | Mizuno et al. |
| 5,882,133 A | 3/1999 | Chao et al. |
| 7,760,327 B2 | 7/2010 | Scherle et al. |

(Continued)

OTHER PUBLICATIONS

German Office Action, with translation thereof, for corresponding DE Appl. No. 10 2019 201 509.3, dated Sep. 17, 2019.

(Continued)

*Primary Examiner* — Mesfin T Asfaw
(74) *Attorney, Agent, or Firm* — Fish & Richardson P.C.

(57) ABSTRACT

An optical arrangement of an imaging device for microlithography, particularly for using light in the extreme UV range, includes an optical element and a holding device for holding the optical element. The optical element includes an optical surface and defines a plane of main extension, in which the optical element defines a radial direction and a circumferential direction. The holding device includes a base element and more than three separate holding units. The holding units are connected to the base element and arranged in a manner distributed along the circumferential direction and spaced apart from one another. The holding units hold the optical element with respect to the base element. Each of the holding units establishes a clamping connection between the optical element and the base element. The clamping connection for each holding unit is separate from the clamping connections of the other holding units.

26 Claims, 3 Drawing Sheets (56) References Cited

U.S. PATENT DOCUMENTS

| | | | |
|---|---|---|---|
| 8,441,747 B2 | 5/2013 | Heintel et al. | |
| 9,134,501 B2* | 9/2015 | Schaffer | G02B 7/026 |
| 2003/0095345 A1 | 5/2003 | Yoshida | |
| 2003/0179470 A1 | 9/2003 | Canon | |
| 2003/0234918 A1* | 12/2003 | Watson | G03F 7/70833 355/53 |
| 2007/0165311 A1 | 7/2007 | Kwan et al. | |
| 2008/0043349 A1 | 2/2008 | Rief et al. | |
| 2010/0214675 A1 | 8/2010 | Kugler et al. | |
| 2015/0055233 A1* | 2/2015 | Erbe | G03F 7/709 359/820 |

OTHER PUBLICATIONS

International Search Report and Written Opinion for corresponding PCT/EP2020/052851, dated Jun. 4, 2020.
International Preliminary Report on Patentability corresponding to PCT application PCT/EP2020/052851, dated Aug. 10, 2021.

* cited by examiner

SUPPORT OF AN OPTICAL ELEMENT

CROSS-REFERENCE TO RELATED APPLICATION

This application claims priority under 35 U.S.C. § 119 to German patent application DE 10 2019 201 509.3, filed Feb. 6, 2019, the entire contents of which is incorporated by reference herein.

FIELD

The present disclosure relates to a microlithographic optical arrangement, optionally suitable for utilizing UV exposure light, such as light in the extreme ultraviolet (EUV) range. Furthermore, the disclosure relates to an optical imaging device including such an arrangement. In general, the disclosure can be used in conjunction with any desired optical imaging methods. It can be used particularly advantageously in the production or the inspection of microelectronic circuits and of the optical components used in such processes (for example optical masks).

BACKGROUND

The optical devices used in conjunction with the production of microelectronic circuits typically include a plurality of optical element units including one or more optical elements, such as lens elements, mirrors or optical gratings, which are arranged in the imaging light path. The optical elements typically cooperate in an imaging process in order to transfer an image of an object (for example a pattern formed on a mask) to a substrate (for example a so-called wafer). The optical elements are typically combined in one or more functional groups held, if appropriate, in separate imaging units. Particularly in the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically include a supporting structure having a substantially ring-shaped outer supporting unit, which supports one or more optical element holders, the latter in turn holding the optical element.

The ever-advancing miniaturization of semiconductor components generally results in a constant demand for increased resolution of the optical systems used for their production. This demand for increased resolution generally results in the demand for an increased numerical aperture (NA) and an increased imaging accuracy of the optical systems.

One approach for obtaining an increased optical resolution involves reducing the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In general, in this EUV range it is no longer possible to use conventional refractive optical systems. This is owing to the fact that, in general, in this EUV range the materials used for refractive optical systems have an absorbance that is too high to achieve acceptable imaging results with the available light power. Consequently, in this EUV range it is generally desirable to use reflective optical systems for the imaging process.

This transition to purely reflective optical systems having a high numerical aperture (e.g. NA>0.4 to 0.5) in the EUV range can yield challenges with regard to the design of the imaging device.

Generally, the factors mentioned above result in relatively stringent desired properties with regard to the position and/or orientation of the optical elements participating in the imaging process relative to one another and also with regard to the deformation of the individual optical elements in order to achieve a desired imaging accuracy. Moreover, it is generally desirable to maintain this relatively high imaging accuracy over operation in its entirety, ultimately over the lifetime of the system.

As a consequence, it can be desirable for the components of the optical imaging device (for example, the optical elements of the illumination device, the mask, the optical elements of the projection device and the substrate) which cooperate during the imaging process to be supported in a well-defined manner in order to maintain a predefined relatively well-defined spatial relationship between these components and to obtain relatively little undesired deformation of these components in order ultimately to achieve the relatively high imaging quality.

An issue that can arise, particularly in the aforementioned EUV systems, is that, given the systematic desired properties, the illumination device and the projection device and at least individual ones of the optical elements can be comparatively large and heavy optical units. However, in order to meet the desired properties in respect of accuracy, these heavy units are desirably exchangeable and correspondingly adjustable. Moreover, it is desirable that they do not experience unwanted or not accurately defined deformations due to the design of their mount. For these reasons, for the purposes of supporting these optical units or elements, use is typically made of a so-called three-point support by way of three detachable holding units, which are uniformly distributed along the circumference (and which are typically configured in to form a so-called hexapod kinematic), as is known, for example, from U.S. Pat. No. 7,760,327 B2 (Scherle et al., the entire disclosure of which is incorporated herein by reference).

Such a three-point support can allow a statically determined mount to be obtained or a statically overdetermined mount to be avoided in order to reduce or avoid unwanted parasitic stresses and deformations in the optical unit arising therefrom, as may occur on account of production inaccuracies or deformations of the support structure.

An issue with such a statically determined three-point support is that, in the case of shock loads, as may occur, for example, when the imaging device is transported, in the most disadvantageous load case with the load having specific load direction, the main load is desirably carried by a single one of the three holding units since the two other holding units are substantially compliant in this load direction and therefore can substantially not carry any loads in that load direction. Therefore, the holding unit desirably has a comparatively robust and complicated design in order to ensure a reliable support of the optical element. Therefore, the detachable connection to the optical element, in particular, can have a complicated design to avoid or reduce the introduction of parasitic stresses (and parasitic deformations resulting therefrom) where possible.

U.S. Pat. No. 8,441,747 B2 (Heintel et al., the entire disclosure of which is incorporated herein by reference) discloses holding an optical element at its external circumference by a multiplicity of holding units that are adhesively bonded to the external circumference of the optical element.

This does achieve a better distribution of the operating loads and a small configuration thanks to the adhesive bonding. However, there can be an issue because adhesive bonding may not facilitate a simple replacement of the optical element.

SUMMARY

The disclosure seeks to provide a microlithographic optical arrangement and a corresponding optical imaging device including such an arrangement, and a method for supporting an optical element, which can a support an optical element in a manner that is relatively robust against shock loads while also having a relatively small size which can facilitate relatively simple replacement of the optical element.

The disclosure is based, in part at least, on the technical teaching that a support of the optical element that, while being robust against shock loads and having a small size, facilitates simple replaceability of the optical element is obtained if more than three holding units, which each hold the optical element by way of a separate clamping connection, are provided. Here, the respective clamping connection can ensure a relatively simple releasability of the connection and hence a relatively simple replaceability of the optical element. Due the division of the loads, in particular the shock loads, occurring at the optical element during production, transport and operation of the imaging device among more than three holding units, a reduction in the maximum load acting on the single holding unit in the worst-case scenario can be achieved. As a result of this, the respective clamping connection can have a simpler and more space-saving design, which in turn can facilitate a further increase in the number of holding units.

Ultimately, by this approach an advantageously high number of holding units can be realized.

Clamping can be advantageous in that the holding force resulting therefrom (i.e., the friction between the clamping surfaces) can be set with comparatively high precision by way of the contact force at the clamping surfaces. Hence, the risk that a shock load to be expected in the most disadvantageous case at a holding unit exceeds the holding force of the holding unit can be relatively reliably reduced without having to provide great safety factors and hence overdimensioning of the holding units. Consequently, the shock safety or failure safety of the system under shock loads can advantageously be increased despite simplified holding units.

According to one aspect, the disclosure relates to an optical arrangement of an imaging device for microlithography, particularly for using light in the extreme UV (EUV) range, including an optical element and a holding device for holding the optical element. Here, the optical element includes an optical surface and furthermore defines a plane of main extension, in which the optical element defines a radial direction and a circumferential direction. The holding device includes a base element and more than three separate holding units, wherein the holding units are connected to the base element and arranged in a manner distributed along the circumferential direction as well as spaced apart from one another. The holding units hold the optical element in a predeterminable position and orientation with respect to the base element. Here, each holding unit establishes a clamping connection between the optical element and the base element, the clamping connection being separate from the clamping connections of the other holding units.

In general, clamping connection between the respective holding unit and the optical element can be established in any suitable manner. In particular, the frictional engagement between one or more respective contact surfaces of the holding unit and the optical element, involved for clamping, can be brought about in any suitable manner. Optionally, a single clamping element can be provided for each holding unit, the clamping element being pressed against a corresponding contact surface on the optical element by way of a suitable tensioning device in order to obtain the frictional engagement of the clamping. Here, the clamping element can, for example, be pretensioned in relation to the optical element by way of its own support on the base element. The corresponding opposing forces can then be applied by one or more adjacent holding units in such a way that the contact forces acting on the optical element in the assembled state cancel one another section-wise, but at least cancel one another overall, and a defined position and orientation of the optical element is achieved.

Particularly simple designs are achievable if at least one of the holding units includes a first clamping element and a second clamping element. Then, the first clamping element and the second clamping element can simply be braced with respect to each other to establish the clamping connection, wherein an interface portion of the optical element is particularly easily clamped between the first clamping element and the second clamping element. Optionally, such a configuration is chosen for each holding unit since a particularly simple overall design is achieved in that case.

Particularly advantageous variants with a low risk of introducing parasitic stresses into the optical element are achieved if the first clamping element and the second clamping element, to establish the clamping connection, are braced with respect to each other via a simple tensioning element. Here, the tensioning element can be designed in the form of a clamping bracket or in the form of a tie rod or tension anchor. Optionally, provision is made for the tensioning element to extend through a recess in the interface portion, as a result of which, in particular locally, a particularly uniform distribution of the clamping force can be obtained. Here, the tensioning element can extend with play through the recess in the interface portion in order to avoid contact between the tensioning element and the interface portion of the optical element, which contact otherwise could possibly lead to parasitic stresses in the optical element.

In principle, the tensioning element can have any suitable design to establish the bracing of the clamping elements against one another and, hence, the clamping of the interface portion. As mentioned, the tensioning element may be a clamping bracket that embraces and braces the two clamping elements. Particularly simple and compact configurations are achieved if the tensioning element includes a threaded portion that is screwed into one of the clamping elements to establish the bracing. Here, it is particularly advantageous if at least one of the clamping elements is connected to the base element by way of a connection portion, wherein the connection portion then is configured in such a way that it restricts a rotational degree of freedom about an axis that extends substantially parallel to a longitudinal axis of the threaded portion. With this approach, it can be ensured in a simple manner that the connection portion can take up at least a majority of the tightening torque of the screw connection such that no parasitic stresses or only very low parasitic stresses are respectively introduced into the optical element.

It will be appreciated that, in principle, the clamping elements can be connected to the base element in any suitable way. In particular, one of the clamping elements may be connected only indirectly to the base element via the aforementioned tensioning element and the other clamping element. Optionally, the first clamping element is connected to the base element via a connection portion and/or the second clamping element is connected to the base element via a connection portion.

By way of example, the connection portion, at least section-wise, can be configured in the manner of a leaf spring. This can yield particularly simple, compact and cost-effective variants. In addition or as an alternative, the connection portion can be configured to be compliant in the radial direction (of the optical element). This can be advantageous, for example, if the optical element and the holding device have different coefficients of thermal expansion. The radial compliance can allow for good thermal deformation decoupling between the optical element and the holding device. In addition or as an alternative, the connection portion, at least section-wise, can extend substantially in a plane perpendicular to the radial direction. This can allow for particularly cost-effective and compact configurations to be obtained.

In certain variants, the first clamping element and the second clamping element may be connected to the base element via a common connection portion. In some variants, the first clamping element is connected to the base element via a first connection portion, and the second clamping element is connected to the base element via a (separate) second connection portion. These variants, alone or in combination, can apply for more than three separate holding units of the holding device, e.g., for all separate holding units of the holding device. In particular in the latter variant, it can be advantageous if the first connection portion and the second connection portion extend substantially parallel to one another because this can lead to a configuration that is particularly easy to produce and assemble but also, under dynamic aspects, advantageously rigid in certain degrees of freedom. In addition or as an alternative, the first connection portion and the second connection portion can be configured in the manner of a parallel guide that is configured to guide the clamping elements, which are braced with respect to each other, substantially parallel to the radial direction. With both latter variants, the above-described radial compliance (for thermal deformation decoupling purposes) can be obtained with dynamically advantageous high rigidity in the remaining degrees of freedom.

In certain embodiments, the first connection portion and the second connection portion can be mutually offset or spaced in the radial direction. In addition or as an alternative, the first connection portion and the second connection portion can be mutually offset in the circumferential direction. Optionally, the first connection portion and the second connection portion are at least substantially mutually aligned in the radial direction (and, hence, substantially not mutually offset in the circumferential direction). In these cases, one of the first connection portion and the second connection portion forms a (radially) inner connection portion while the other one forms a (radially) outer connection portion. All these embodiments can provide proper support allowing compliance in certain degrees of freedom while yielding (dynamically advantageous) rigid support in other degrees of freedom as described above.

In general, the optical element may have any design for the purposes of establishing the respective clamping connection to the holding units. Thus, it may include, for example, a single interface portion, which is provided for the clamping to the holding units. In certain variants, the optical element includes a separate interface portion for establishing the respective clamping connection with the respective holding unit, the interface portion serving to be clamped with the respective holding unit. Here, as described above, the interface portion of the optical element can be clamped between two clamping elements of the respective holding unit.

Generally, the interface portions and the holding units may be combinable with one another as desired, i.e., no specific pairing is provided between the interface portions and the holding units (for example, the optical element and the base element with the holding units can thus be arbitrarily rotated with respect to one another along the circumferential direction). In some cases, such specific pairing is realized by a correspondingly different design and/or arrangement of the components. Here, an interface portion can be configured to be combinable with a first holding unit but not with a second holding unit. To do so, for example, the pairing of the interface portion and the associated holding unit, in particular its clamping elements, may noticeably deviate from other pairings, for example, in the dimension along the clamping direction and/or in the structure or configuration of the clamping surfaces. Moreover, with certain designs with uneven distribution of the holding units along the circumference, this uneven distribution may be used to ensure that only one or a defined sub-set of rotational alignments is possible for establishing all the clamping connections. In particular, one single pair of and interface portion and the associated holding unit deviating from an even distribution may be sufficient to define precisely one single possible rotational alignment (along the circumferential direction U) between the optical element and the holding device for proper clamping.

In general, the interface portion of the optical element can be realized at the optical element in any suitable manner. Particularly compact and simple designs can be achieved if the respective interface portion of the optical element is formed by a projection of the optical element. Here, a plurality of interface portions may be formed at a common projection of the optical element. Furthermore, all interface portions may be formed at a ring-shaped projection of the optical element. The projection of the optical element may extend in the circumferential direction and/or in a direction which is perpendicular to a plane defined by the circumferential direction and the radial direction.

In general, the respective interface portion may be designed in any suitable way desired. By way of example, it could be formed directly at a main body of the optical element. In variants, which can be executed relatively easily and with relatively high precision, the respective interface portion can be formed by an interface element that is connected to the optical element. Here, the interface element may be inserted into a recess of the optical element, wherein the interface element, in particular, may be inserted in a recess in a projection of the optical element. Such configurations can be produced particularly easily. The interface element may include a connector bushing, for example. This connector bushing may include a collar that facilitates simple and precise production and assembly.

In general, the optical element can be produced from any suitable material in single part or multi-part fashion. Optionally, the optical element, at least in the region of the projection, is produced from a ceramic material. As examples, the ceramic material can include SiSiC, the ceramic material can be produced from a material that includes Zerodur, and/or the ceramic material can include a lens material. In variants with an interface element, the latter can be produced from a material including Invar and/or stainless steel and/or molybdenum.

In general, the optical surface can be any refractive and/or reflective and/or diffractive optical surface. Advantages disclosed herein can take effect particularly well if the optical surface is a reflecting optical surface. The optical surface can, for example, be arranged on a main body of the optical element. The main body can include at least one projection on a side facing away from the optical surface, with the projection forming an interface portion to at least one of the holding units.

In general, the base element can have an arbitrary design. Thus, for example, a plate shaped base element may be provided. In some compact variants, the base element has a ring-shaped configuration. In certain designs, the base element defines a plane of main extension of the base element, and at least one of the holding units projects from the base element in a manner substantially perpendicular to the plane of main extension of the base element. Optionally, this applies to all holding units, such that the holding units all project from the base element in a manner substantially perpendicular to the plane of main extension of the base element. In a variant with a ring-shaped base element, this can yield a crown-like design, in which the holding units project from the ring-shaped base element in the manner of the tines of a crown.

In general, the holding device may be constructed in any suitable manner from a plurality of separate components in a so-called differential construction. In certain variants, which can be relatively robust and relatively precisely produced, the base element is monolithic with at least one of the holding units (optionally with all holding units).

As already mentioned above, there can be as many holding units as possible, their number being restricted by the available installation space which depends on the size of the optical element. Optionally, at least 6 (e.g., at least 7, at least 8, at least 9, at least 10, at least 15, at least 18, at least 20, at least 25, at least 30) holding units are provided, and/or at most 40 (e.g., at most 36, at most 30, at most 25) holding units are provided. In some cases, 6 to 40 (e.g., 18 to 36) holding units are provided. The holding units can be arranged in any distribution. In particular, the distribution can be adapted to the mass distribution of the optical element and/or to the expected load directions (of shock loads, in particular). In certain variants, the holding units are arranged with a substantially uniform distribution along the circumferential direction. In particular, this can take account of situations where loads may occur in any direction.

The present disclosure also relates to an optical imaging device, in particular for microlithography, including an illumination device including a first optical element group, an object device for receiving an object, a projection device including a second optical element group and an image device, wherein the illumination device is configured to illuminate the object and the projection device is configured to project an image of the object onto the image device. The illumination device and/or the projection device can include at least one optical arrangement according to the disclosure. This can make it possible to realize the variants and advantages described above to the same extent, and so reference is made to the explanations given above in this respect.

The present disclosure furthermore relates to a method for supporting an optical element for microlithography, particularly for using light in the extreme UV (EUV) range, wherein the optical element is held by a holding device, and the optical element including an optical surface and defining a plane of main extension, in which the optical element defines a radial direction and a circumferential direction. Here, the optical element is held with respect to a base element of the holding device by more than three separate holding units of the holding device, the holding units being arranged in a manner distributed along the circumferential direction and spaced apart from one another. Each holding unit establishes a clamping connection between the optical element and the base element, with the clamping connection being separate from the clamping connections of the other holding units. This can make it possible to realize the variants and advantages described above to the same extent, and so reference is made to the explanations given above in this respect.

In view of a pre-stress-free or defined assembly (with the generation of parasitic stresses in the optical element being at least largely avoided), it can be particularly advantageous if the respective clamping connections between three holding units of the holding device and the optical element are established in a first step so that the optical element is secured in space with respect to the base element. Thus, support in the manner of a conventional three-point support can consequently be realized first. This may be achieved by three (first) holding units which are specifically designed for this initial fixation of the optical element and which differ from the remaining holding units. In particular, these three (first) holding units may have a more rigid design than the remaining (second) holding units. Then, the respective clamping connections between the remaining (second) holding units of the holding device and the optical element can established in a second step which follows the first step. Here, in particular in the direction of the movement involved for clamping purposes, the remaining (second) holding units may have a significantly lower rigidity than the three (first) holding units so as thus to be able to compensate production inaccuracies without generating noteworthy restoring forces and hence parasitic stresses. According to a further aspect, the disclosure relates to an optical arrangement of an imaging device for microlithography, particularly for using light in the extreme UV (EUV) range, including an optical element and a holding device for holding the optical element. Here, the optical element includes an optical surface and furthermore defines a plane of main extension, in which the optical element defines a radial direction and a circumferential direction. The holding device includes a base element and more than three separate holding units, wherein the holding units are connected to the base element and arranged in a manner distributed along the circumferential direction as well as spaced apart from one another. The holding units hold the optical element in a predeterminable position and orientation with respect to the base element. Here, each holding unit establishes a clamping connection between the optical element and the base element, the clamping connection being separate from the clamping connections of the other holding units. At least one of the holding units, optionally each holding unit, includes a first clamping element and a second clamping element. The first clamping element is connected to the base element via a first connection portion, while the second clamping element is connected to the base element via a second connection portion separate from the first connection portion. The first clamping element and the second clamping element are braced with respect to each other to establish the clamping connection, and an interface portion of the optical element is clamped between the first clamping element and the second clamping element. This arrangement can realize the variants and advantages as described above to the same extent, and so reference is made to the explanations given above in this respect.

In a general aspect, the disclosure provides an arrangement that includes: an optical element comprising an optical surface; and a holding device comprising a base element and more than three separate holding units, wherein: the optical element defines a plane of main extension and a circumferential direction in the plane of main extension; the holding units are connected to the base element; the holding units are spaced apart from each other along the circumferential direction; the holding units hold the optical element with respect to the base element; and for each holding unit: the holding unit establishes a clamping connection between the optical element and the base element; and the clamping connection is separate from the clamping connections of other holding units.

In a general aspect, the disclosure provides an arrangement that includes: an optical element comprising an optical surface; and a holding device comprising a base element and more than three separate holding units, wherein: the optical element defines a plane of main extension and a circumferential direction; the holding units are connected to the base element; the holding units are spaced apart from each other along the circumferential direction; the holding units hold the optical element with respect to the base element; for each holding unit: the holding unit establishes a clamping connection between the optical element and the base element; and the clamping connection is separate from the clamping connections of other holding units; at least one of the holding units comprises first and second clamping elements; and for each of the at least one of the holding units comprising first and second clamping elements: the first clamping element is connected to the base element via a first connection portion; the second clamping element is connected to the base element via a second connection portion separate from the first connection portion; the first and second clamping elements are braced with respect to each other to establish the clamping connection; and an interface portion of the optical element is clamped between the first clamping element and the second clamping element.

In a general aspect, the disclosure provides an arrangement that includes: an optical element comprising an optical surface; and a holding device comprising a base element and more than three separate holding units, wherein: the optical element defines a plane of main extension and a circumferential direction; the holding units are connected to the base element; the holding units are spaced apart from each other along the circumferential direction; the holding units hold the optical element with respect to the base element; for each holding unit: the holding unit establishes a clamping connection between the optical element and the base element; and the clamping connection is separate from the clamping connections of other holding units; at least one of the holding units comprises a first clamping unit and second clamping unit separate from the first clamping unit; and for each of the at least one of the holding units comprising first and second clamping units: the first clamping unit is connected to the base element at a first location; the second clamping unit is to the base element each at a second location which is different from the first location; the first and second clamping units are braced with respect to each other to establish the clamping connection; and an interface portion of the optical element is clamped between the first clamping unit and the second clamping unit.

In a general aspect, the disclosure provides a device that includes: an illumination device comprising a first optical element group; and a projection device comprising a second optical element group, wherein: the illumination device is configured to illuminate an object; the projection device is configured to project an image of the object onto an image device; and at least one member selected from the group consisting of the illumination device and the projection device comprises an arrangement described herein.

In a general aspect, the disclosure provides a method of using a device which includes an illumination device and a projection device. The method includes: using the illumination device to illuminate an object; and using the projection device to project at least a portion of the illuminated object onto an image device, wherein: the illumination device is configured to illuminate an object; the projection device is configured to project an image of the object onto an image device; and at least one member selected from the group consisting of the illumination device and the projection device comprises an arrangement described herein.

In a general aspect, the disclosure provides a method of holding an optical element including an optical surface. The method includes: using a holding device to hold an optical element, the optical element comprising an optical surface, wherein: the optical element defines a plane of main extension in which the optical element defines a circumferential direction; the optical element is held with respect to a base element of the holding device via more than three separate holding units of the holding device; the holding units are spaced from each other along the circumferential direction; and for each holding unit: the holding unit establishes a clamping connection between the optical element and the base element; and the clamping connection is separate from the clamping connections of the other holding units.

Further aspects and embodiments of the disclosure are apparent from the following description of exemplary embodiments, which relates to the accompanying figures, and from the claims. All combinations of the disclosed features, irrespective of whether or not they are the subject of a claim, are considered to fall within the scope of the disclosure.

DETAILED DESCRIPTION OF EXEMPLARY EMBODIMENTS

An exemplary embodiment of a microlithographic projection exposure apparatus 101 according to the disclosure, which includes an exemplary embodiment of an optical arrangement according to the disclosure, is described below, as an example, with reference to FIGS. 1 to 6. To simplify the following explanations, an x, y, z coordinate system is indicated in the drawings, the z direction corresponding to the direction of gravitational force. It goes without saying that it is possible in further configurations to choose any desired other orientations of an x, y, z coordinate system.

Figure 1:
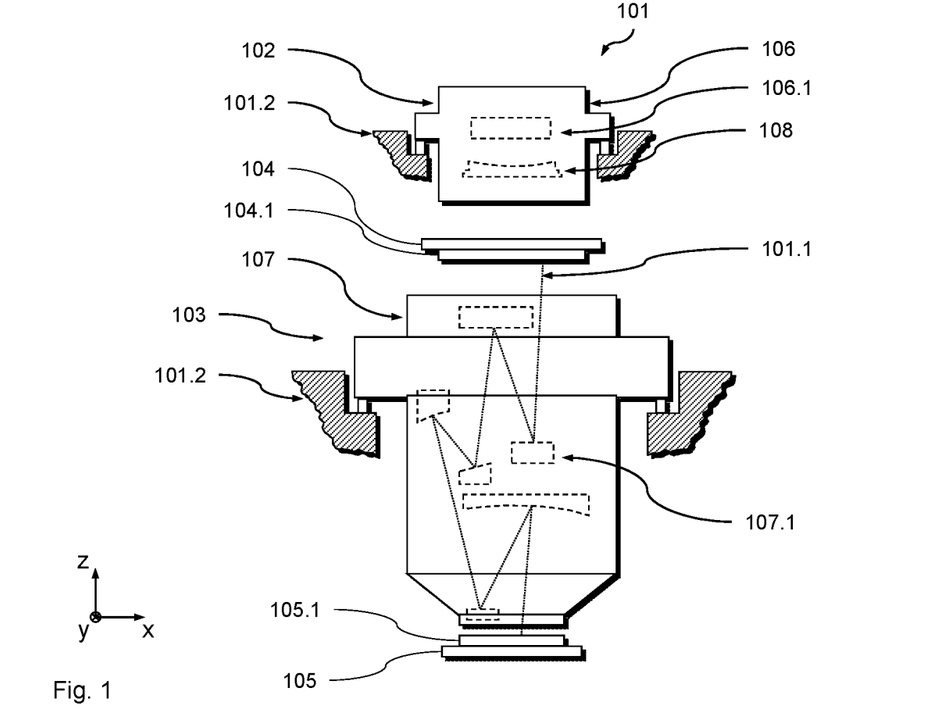
FIG. 1 is a schematic illustration of an exemplary embodiment of the projection exposure apparatus according to the disclosure, which includes an exemplary embodiment of an optical arrangement according to the disclosure.

FIG. 1 is a schematic, not-to-scale representation of the projection exposure apparatus 101, which is used in a microlithographic process for producing semiconductor components. The projection exposure apparatus 101 includes an illumination device 102 and a projection device 103. The projection device 103 is designed to transfer an image of a structure of a mask 104.1, which is arranged in a mask unit 104, onto a substrate 105.1, which is arranged in a substrate unit 105, in an exposure process. For this purpose, the illumination device 102 illuminates the mask 104.1. The optical projection device 103 receives the light from the mask 104.1 and projects the image of the mask structure of the mask 104.1 onto the substrate 105.1, such as for example a wafer or the like.

The illumination device 102 includes an optical unit 106 including an optical element group 106.1. The projection device 103 includes a further optical unit 107 including an optical element group 107.1. The optical element groups 106.1, 107.1 are arranged along a folded central ray path 101.1 of the projection exposure apparatus 101. Each optical element group 106.1, 107.1 can include a multiplicity of optical elements.

In the present embodiment, the projection exposure apparatus 101 operates with exposure light in the EUV range (extreme ultraviolet radiation), with wavelengths of between 5 nm and 20 nm, in particular, with a wavelength of 13 nm. The optical elements of the element groups 106.1, 107.1 of the illumination device 102 and the projection device 103 are therefore exclusively reflective optical elements. The optical element groups 106.1, 107.1 may include one or more optical arrangements according to the disclosure, as is described below on the basis of the optical arrangement 108. The optical units 106 and 107 are each supported by way of a support structure 101.2.

In further configurations of the disclosure, it is also possible (in particular depending on the wavelength of the illumination light), of course, to use any type of optical element (refractive, reflective, diffractive) alone or in any desired combination for the remaining optical modules.

Figure 2:
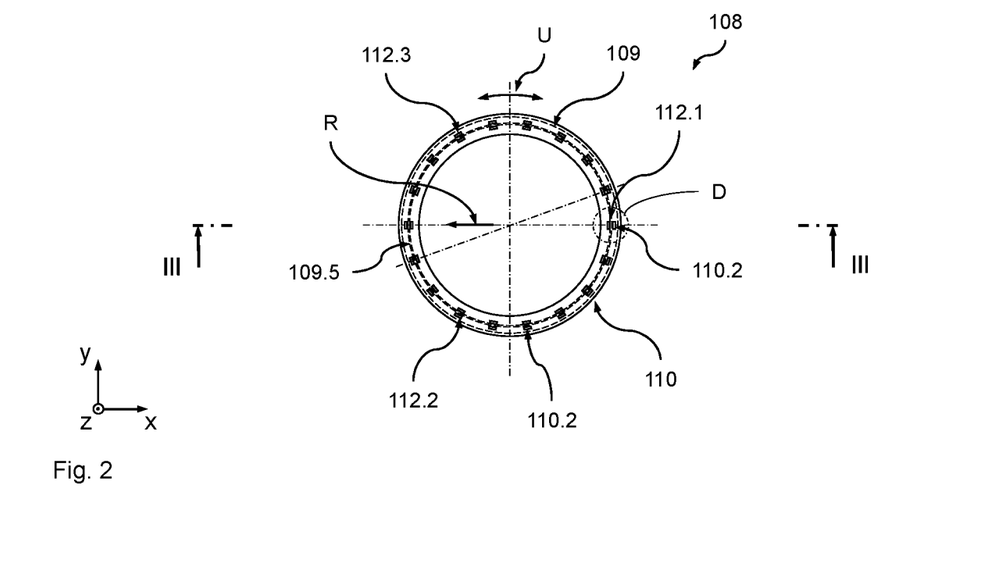
FIG. 2 is a schematic plan view of the holding device of the arrangement according to the disclosure from FIG. 1.
Figures 3A, 3B:
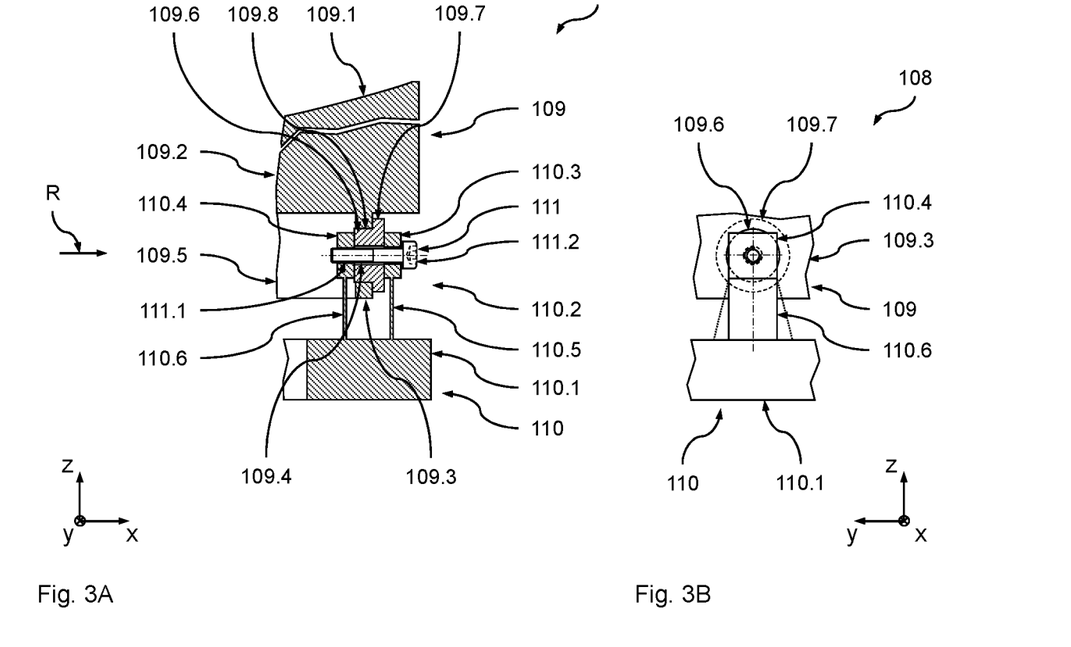
FIG. 3A is a schematic sectional view (along the line III-III in FIG. 2) of a part (detail D) of the arrangement according to the disclosure from FIG. 2.
FIG. 3B is a schematic view of the part of the arrangement from FIG. 3A (seen in the radial direction R of FIG. 3A).

The optical arrangement according to the disclosure is described below in exemplary fashion on the basis of the optical arrangement 108. FIG. 2 shows a schematic plan view of part of the optical arrangement 108, while FIG. 3A shows a schematic sectional view (along line III-III of FIG. 2) of part of the optical arrangement 108. FIG. 3B is a schematic view of the part of the arrangement from FIG. 3A seen in the radial direction R of FIG. 3A.

As may be gathered from FIG. 2 and FIGS. 3A and 3B (which show the detail D of FIG. 2), in particular, the optical arrangement 108 includes an optical element 109 in the form of a collector mirror of the illumination device 102 and a holding device 110 for holding the optical element 109. FIG. 2 shows a plan view of the holding device 110 (along the z-direction), in which the optical element 109 is indicated by way of its dashed external contour.

The optical element 109 includes a reflective optical surface 109.1 which is formed (in conventional fashion) on one side (the front side) of a main body 109.2 of the optical element 109. The optical element 109 defines a plane of main extension (parallel to the xy-plane or plane of the drawing of FIG. 2, respectively), in which the optical element 109 defines a radial direction R and a circumferential direction U.

In the present example, the holding device 110 includes a base element 110.1 and separate holding units 110.2, wherein the holding units 110.2 are connected to the base element 110.1 and arranged in a manner distributed along the circumferential direction U and spaced apart from one another. The holding units 110.2 hold the optical element 109 with respect to the base element 110.1 in a predetermined position and orientation. Each holding unit 110.2 establishes a clamping connection between the optical element 109 and the base element 110.1, the clamping connection being separate from the clamping connections provided by the other holding units 110.2.

As already mentioned, there can be as many holding units 110.2 as possible, the number of holding units 110.2 being restricted by the available installation space which depends on the size of the optical element 109. In the present example 18 holding units 110.2 are provided. However, a different number may also be provided in other variants. There can be at least 6 (e.g., at least 7, at least 8, at least 9, at least 10, at least 15, at least 18, at least 20, at least 25, at least 30) holding units 110.2 provided, and/or there can be at most 40 (e.g., at most 36, at most 30, at most 25) holding units 110.2 provided. In some cases, 6 to 36 (e.g., 18 to 36) holding units 110.2 are provided.

In the present example, the holding units 110.2 are arranged uniformly distributed along the circumferential direction U with a respective angular spacing of 20°. With this approach, it can be achieved that the attachment always has substantially the same behavior, independently of the load direction of a load, for example a shock load, introduced into the optical element, or that there is no load direction in which shock loads involve an increased risk of leading to a misalignment of the optical element 109.

However, it is understood that, in other variants, the holding units 110.2 may be arranged as desired with an at least section-wise uneven distribution. In particular, the distribution of the holding units 110.2 may be adapted in this case to the mass distribution of the optical element 109 and/or to expected accelerations of the arrangement 108 and load directions resulting therefrom. The holding units 110.2 may be exposed to higher loads in certain regions, particularly in the case of an asymmetric optical element 109, and so it is expedient to have an asymmetric distribution with an increased concentration of the holding units 110.2 (i.e., a locally greater number of holding units per circumferential angle) in these regions subject to higher loads.

As may be gathered from FIG. 3A, in particular, each holding unit 110.2 in the present example has a first clamping element 110.3 (here: an outer clamping element in the radial direction R) and a second clamping element 110.4 (here: an inner clamping element in the radial direction R). The first clamping element 110.3 is connected to the base element 110.1 via a first connection portion 110.5, while the second clamping element 110.4 is connected to the base element 110.1 via a second connection portion 110.6. Without limiting the disclosure, FIG. 3A shows two separate clamping units: a first clamping unit with the first clamping element 110.3 and its associated first connection portion 110.5; and a separate second clamping unit with the second clamping element 110.4 and its associated second connection portion 110.6.

For the purposes of establishing the clamping connection to the optical element 109, the first clamping element 110.3 and the second clamping element 110.4 are braced with respect to each other by way of a tensioning element 111 in the form of a tensioning screw. An associated interface portion 109.3 of the optical element 109 is respectively clamped between the first clamping element 110.3 and the second clamping element 110.4 of the respective holding unit 110.2.

However, in other variants, the clamping connection between the respective holding unit 110.2 and the optical element 109 may also have a different design. For example, the frictional engagement involved for clamping may eventually be realized by only a single clamping element 110.3 or 110.4 per holding unit 110.2, provided the clamping element 110.3 or 110.4 is pressed against the associated contact surface on the interface portion 109.3 of the optical element 109 by way of a suitable tensioning device (e.g., a connection portion 110.5 or 110.6 under appropriate pretension in the radial direction R) to obtain the frictional engagement of the clamping connection. The corresponding opposing forces can then be applied by one or more adjacent holding units 110.2 in such a way that the contact forces acting on the optical element 109 in the assembled state cancel one another at least section-wise, but at least cancel one another overall, and, thus, a defined position and orientation of the optical element 109 is achieved.

In the present example, the tensioning element 111 is designed in the manner of a tie rod. The tensioning element 111 extends with play through a recess 109.4 in the interface portion 109.3, as a result of which a particularly uniform distribution of the clamping force is obtained. Due to the play between the tensioning element 111 and the interface portion 109.3 in the region of the recess 109.9, contact between the tensioning element 111 and the interface portion 109.3 is avoided, which could otherwise lead to parasitic stresses in the optical element.

Consequently, perpendicular to the radial direction R, between the contact surfaces of the clamping elements 110.3, 110.4 and the associated contact surfaces of the interface portion 109.3 only the frictional engagement of the clamping connection is present, which is precisely defined by way of the pretension of the tensioning element 111. This is advantageous in that the holding force resulting from the clamping, and hence the contact force at the clamping surfaces, can be set with comparatively high precision by way of the pretension in the tensioning element 111.

The tensioning element 111 passes through a passage opening in the outer, first clamping element 110.4 and through the recess 109.9. In the present example, the tensioning element 111 includes a threaded portion 111.1 which is screwed into a corresponding threaded bore in the inner, second clamping element 110.4 for bracing purposes. The screw head 111.2 of the tensioning element 111 rests on the outer, first clamping element 110.4.

In the present example it is particularly advantageous that the respective connection portions 110.5, 110.6 of the two clamping elements 110.3, 110.4 restrict a degree of rotational freedom about an axis that extends substantially parallel to the longitudinal axis of the threaded portion 111.1. This ensures in a simple way that the respective connection portion 110.5, 110.6 can take up at least a majority of the tightening torque of the screw connection such that no parasitic stresses or only very low parasitic stresses are respectively introduced into the optical element.

To this end, like in the present example, the respective connection portion 110.5, 110.6 can be configured in the manner of a leaf spring, the leaf spring in the present example extending substantially in a plane perpendicular to the radial direction R. This yields a particularly simple and compact configuration.

As can be seen, in particular, from FIG. 3B, the respective connection portion 110.5, 110.6 is formed by a substantially rectangular leaf spring. In the present example, the connection portions 110.5, 110.6 are substantially identical. It will be appreciated, however, that with other variants the respective connection portion 110.5, 110.6 may have any other desired and suitable design deviating from each other. It will be further appreciated that with other variants the respective connection portion 110.5, 110.6 may have any other desired and suitable outer contour (e. g., a trapezoid contour as indicated by the dotted contour in FIG. 3B). The respective design of the connection portion 110.5, 110.6 (in particular, the respective outer contour) may, for example, be chosen to define a desired distribution of the rigidity of the connection portion 110.5, 110.6 (in the radial direction R) along the longitudinal axis of the connection portion 110.5, 110.6.

Moreover, as a result thereof, the respective connection portion 110.5, 110.6 is compliant in the radial direction R. This is advantageous, in particular, if the optical element 109 and the holding device 110 have different coefficients of thermal expansion. This radial compliance then allows obtaining good thermal deformation decoupling between the optical element 109 and the holding device 110.

The first connection portion 110.5 and the second connection portion 110.6 extend substantially parallel to one another, yielding a configuration that is particularly easy to produce and assemble. Moreover, this configuration is advantageous under dynamic aspects as it is advantageously rigid in the degrees of freedom that are parallel to the plane of the respective connection portion 110.5, 110.6.

As can be seen particularly well from FIG. 3A, the first connection portion 110.5 and the second connection portion 110.6 are mutually offset or spaced in the radial direction R. Hence, the first connection portion 110.5 forms a (radially) outer connection portion while the second connection portion 110.6 forms a (radially) inner connection portion. It will be appreciated that, with certain variants, the first connection portion 110.5 and the second connection portion 110.6 may be mutually offset in the circumferential direction U. Optionally, however, as with the present example, the first connection portion 110.5 and the second connection portion 110.6 are substantially mutually aligned in the radial direction R (and, hence, substantially not mutually offset in the circumferential direction U).

Moreover, in the present example, the first connection portion 110.5 and the second connection portion 110.6 provide a parallel guide that guides the clamping elements 110.3, 110.4, which are braced with respect to each other, in a manner substantially parallel to the radial direction R. Hence, the above-described radial compliance (for thermal deformation decoupling purposes) can be obtained with dynamically advantageous high rigidity in the remaining degrees of freedom.

In the present example, the respective interface portion 109.3 of the optical element 109 is formed at a projection 109.5 circumferentially extending (in the circumferential direction U) in ring-shaped manner on the back side of the optical element 109 (facing away from the optical surface 109.1). The projection 109.5 extends in the circumferential direction U and in a direction perpendicular to the plane of main extension of the optical element 109 (i.e., the plane defined by the circumferential direction U and the radial direction R).

In the present example, all interface portions 109.3 are formed at the common projection 109.5. In other variants, however, the projection 109.5 may also be interrupted in the circumferential direction U such that the interface portions 109.3 are provided individually or in groups, respectively, at separate circumferential segments of the projection 109.5.

In the present example, a design that is realizable particularly easily and with high precision emerges by virtue of the respective interface portion 109.3 being formed by an interface element 109.6 that is connected to the optical element 109 in the region of the projection 109.5. Here, the interface element 109.6 is configured as a connector bushing with a collar 109.7, which is inserted into a recess 109.8 of the projection 109.5 of the optical element 109 and which is attached thereto in a suitable manner (e.g., via a material connection by way of adhesive bonding, soldering, etc.).

This configuration is particularly simple to produce since the connector bushing 109.6 forms the contact surfaces to the clamping elements 110.3, 110.4. It is substantially easier to establish these contact surfaces to the clamping elements 110.3, 110.4 at the ends of the connector bushing 109.6 than at the projection 109.5. In this case, only the radial recesses 109.8 need to be produced on the projection 109.5, in which the connector bushings 109.6 can be received and attached comparatively easily with a sufficiently high precision.

However, it is understood that, in other variants, the respective interface portion 109.3 may also be directly formed at the main body 109.2 of the optical element 109, in particular at the projection 109.5.

It may be provided that the interface portions 109.3 and the holding units 110.2 are combinable with one another as desired; i.e., no specific pairing is provided between the interface portions 109.3 and the holding units 110.2 (for example, the optical element 109 and the base element 110.1 with its holding units 110.2 can thus be arbitrarily rotated with respect to one another along the circumferential direction U).

In other variants, however, such specific pairing can be realized by a correspondingly different design and/or arrangement of the components of the interface portions 109.3 and the holding units 110.2. Then, an interface portion 109.3 can be configured in such a way that, although it is combinable with a (first) holding unit 110.2, it is not combinable with another (second) holding unit 110.2.

To do so, for example, the pairing of the interface portion 109.3 and the associated holding unit 110.2, in particular, its clamping elements 110.3, 110.4, may noticeably deviate from other pairings, e.g. in the dimension along the clamping direction (i.e., along the longitudinal axis of the tensioning element 111, for example) and/or in the structure or configuration of the mating clamping surfaces of the interface portion 109.3 and the clamping elements 110.3, 110.4.

Moreover, with certain designs with uneven distribution of the holding units 110.2 (and mating interface portions 109.3) along the circumferential direction U, this uneven distribution may be used to ensure that only one or a defined sub-set of rotational alignments is possible for establishing all the clamping connections. In particular, one single pair of and interface portion 109.3 and the associated holding unit 110.2 deviating from an even circumferential distribution may be sufficient to define precisely one single possible rotational alignment (along the circumferential direction U) between the optical element 109 and the holding device 110 allowing proper clamping.

In view of a stress-free or defined assembly (with the generation of parasitic stresses in the optical element 109 at least being largely avoided), it is particularly advantageous if the respective clamping connections between three holding units 110.2 of the holding device 110 and the optical element 109 are initially established in a first step during the assembly in such a way that the optical element is secured in space with respect to the base element 110.1. Thus, securing the optical element 109 with respect to the holding device 110 in the manner of a conventional three-point support can be realized first.

This may achieved by three (first) holding units 110.2 which are specifically designed for this initial attachment of the optical element 109 and which differ from the remaining holding units 110.2. In the present example, these could be the holding units 110.2 at the three positions 112.1, 112.2 and 112.3 (see FIG. 2), which are each arranged with respect to one another in a manner rotated through 120° in the circumferential direction. In particular, these three (first) holding units 110.2 may have a more rigid design than the remaining (second) holding units 110.2.

Then, the respective clamping connections between the remaining (second) holding units 110.2 of the holding device 110 and the optical element 109 are established in a second step of the assembly process, which second step follows the first step. The remaining (second) holding units 110.2 may have a significantly lower rigidity in the direction of the movement involved for clamping purposes (i.e., in the radial direction R in the present example) than the three (first) holding units 110.2 so as thus to be able to compensate production inaccuracies without generating noteworthy restoring forces and hence parasitic stresses.

In principle, the optical element 109 can be produced from any suitable material in single part fashion (i.e., monolithic) or multi-part fashion (so called differential construction). Optionally, the optical element 109, at least in the region of the projection 109.5, is produced from a ceramic material, the ceramic material in particular including SiSiC. In addition or as an alternative, the optical element 109, at least in the region of the projection 109.5, may be produced from a material including Zerodur and/or a lens material. In the above-described variants with an interface element 109.6, the latter can be produced from a material including Invar and/or stainless steel and/or molybdenum.

In principle, the base element 110.1 can likewise have an arbitrary suitable design. Thus, for example, a plate-shaped base element 110.1 may be provided. In the present example, the base element 110.1 is ring-shaped, wherein it defines a plane of main extension of the base element. The holding units 110.2 project from the base element 110.1 in a manner substantially perpendicular to the plane of main extension of the base element 110.1. This yields a crown-like design, in which the holding units 110.2 project from the ring-shaped base element 110.1 in the manner of the tines of a crown.

In principle, the holding device 110 may be constructed in any suitable manner from a plurality of separate components in a so-called differential construction. In the present example, the base element 110.1 has an integral or monolithic design with all holding units 110.2, as a result of which a particularly robust design arises that can be produced with high precision.

Figure 4:
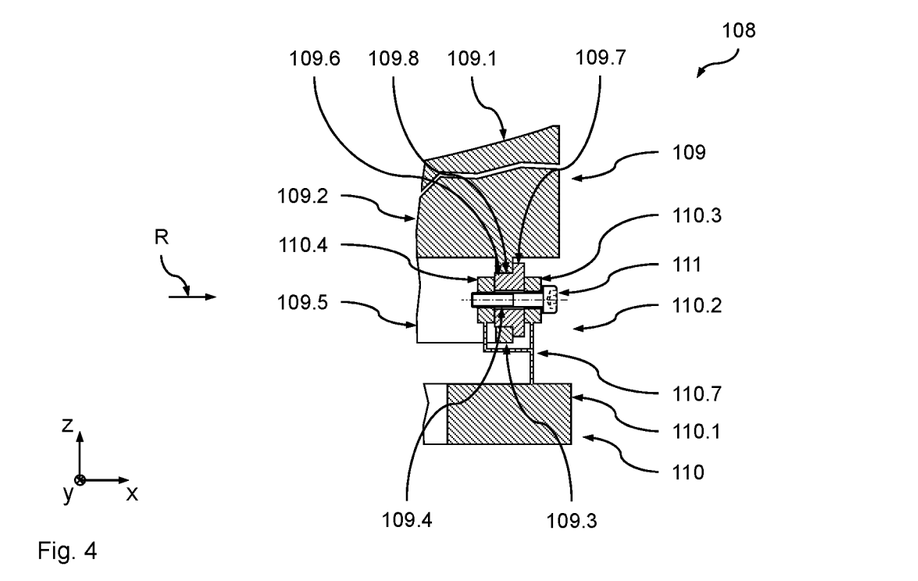
FIG. 4 is a schematic sectional view of part of a variant of the arrangement according to the disclosure from FIG. 2 (similar to the view of FIG. 3A).

FIG. 4 shows a variant of the holding device 110 from FIG. 3A with otherwise an identical design. In this variant, the respective inner, second clamping element 110.4 in individual or all holding units 110.2 is only indirectly connected to the base element 110.1 via the aforementioned tensioning element and a now fork-shaped connection portion 110.7 (made of corresponding leaf spring portions), the connection portion 110.7 being shared by the first clamping element 110.3 and the second clamping element 110.4. For certain applications, this configuration is advantageous in that the holding unit 110.2 then does not restrict the rotational degree of freedom around the axis tangential to the circumferential direction U (i.e., the axis parallel to the y-axis in FIG. 4).

Figure 5:
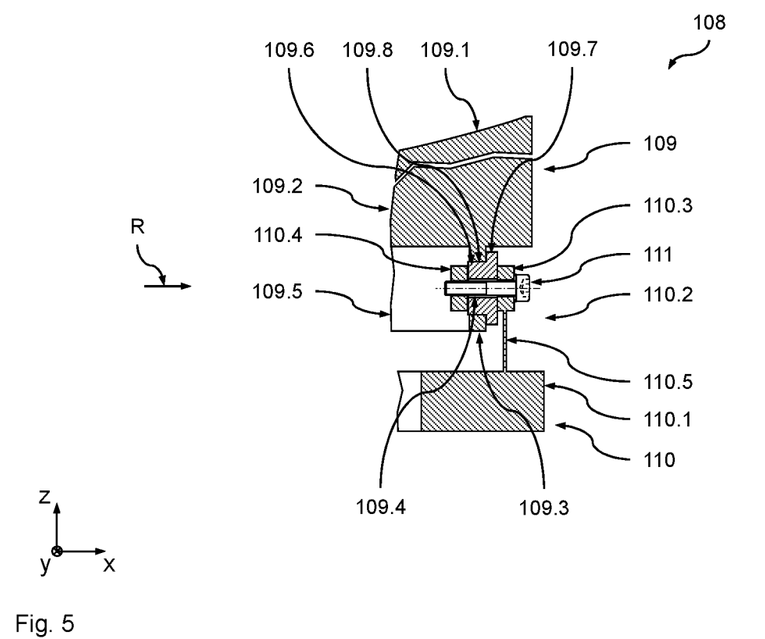
FIG. 5 is a schematic sectional view of part of a further variant of the arrangement according to the disclosure from FIG. 2 (similar to the view of FIG. 3A).

FIG. 5 shows a further variant of the holding device 110 from FIG. 3A with otherwise an identical design. In this variant, the respective inner, second clamping element 110.4 in individual or all holding units 110.2 is only indirectly connected to the base element 110.1 via the aforementioned tensioning element, the first clamping element 110.3 and its connection portion 110.5 (consequently, the second connection portion 110.6 is therefore missing). For certain applications, this configuration is once again advantageous in that the holding unit 110.2 then does not restrict the rotational degree of freedom around the axis tangential to the circumferential direction U (i.e., the axis parallel to the y-axis in FIG. 5).

Figure 6:
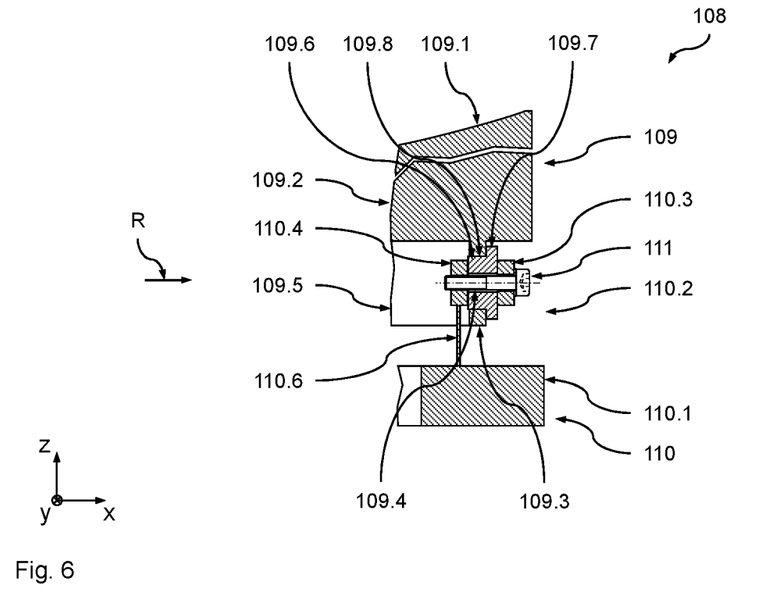
FIG. 6 is a schematic sectional view of part of a further variant of the arrangement according to the disclosure from FIG. 2 (similar to the view of FIG. 3A).

FIG. 6 shows a further variant of the holding device 110 from FIG. 3A with otherwise an identical design. In this variant, the respective outer, first clamping element 110.3 in individual or all holding units 110.2 is only indirectly connected to the base element 110.1 via the aforementioned tensioning element, the second clamping element 110.4 and its connection portion 110.6 (consequently, the first connection portion 110.5 is therefore missing). For certain applications, this configuration is once again advantageous in that the holding unit 110.2 then does not restrict the rotational degree of freedom around the axis tangential to the circumferential direction U (i.e., the axis parallel to the y-axis in FIG. 6).

The present disclosure was described above exclusively on the basis of examples from the field of microlithography. However, it is understood that the disclosure can also be used in the context of any other optical applications, in particular imaging methods at different wavelengths, in which similar problems arise in respect of the support of heavy optical units.

Furthermore, the disclosure can be used in connection with the inspection of objects, such as for example so-called mask inspection, in which the masks used for microlithography are inspected for their integrity, etc. In FIG. 1, a sensor unit, for example, which detects the imaging of the projection pattern of the mask 104.1 (for further processing), then takes the place of the substrate 105.1. This mask inspection can then take place both substantially at the same wavelength as is used in the later microlithographic process. However, it is likewise possible also to use any desired wavelengths deviating therefrom for the inspection.

Finally, the present disclosure has been described above on the basis of specific exemplary embodiments showing specific combinations of the features defined in the following patent claims. It should expressly be pointed out here that the subject matter of the present disclosure is not restricted to these combinations of features, rather all other combinations of features such as are evident from the following patent claims also belong to the subject matter of the present disclosure.

What is claimed is:

1. An arrangement, comprising:
an optical element comprising an optical surface;
a holding device comprising a base element and more than three separate holding units, the more than three separate holding units comprising a first holding unit; and
a leaf spring connecting the first holding unit to the base element,
wherein:
the optical element defines a plane of main extension, a radial direction in the plane of main extension, and a circumferential direction in the plane of main extension;
the leaf spring is configured so that the connection of the first holding unit to the base element is compliant in the radial direction and rigid in a direction perpendicular to the plane of main extension;
the holding units are connected to the base element;
the holding units are spaced apart from each other along the circumferential direction;
the holding units hold the optical element with respect to the base element; and
for each holding unit:
the holding unit establishes a clamping connection between the optical element and the base element; and
the clamping connection is separate from the clamping connections of other holding units.

2. A device, comprising:
an illumination device comprising a first optical element group; and
a projection device comprising a second optical element group,
wherein:
the illumination device is configured to illuminate an object;
the projection device is configured to project an image of the object onto an image device; and
at least one member selected from the group consisting of the illumination device and the projection device comprises an arrangement according to claim 1.

3. A method of using a device which comprises an illumination device and a projection device, the method comprising:
using the illumination device to illuminate an object; and
using the projection device to project at least a portion of the illuminated object onto an image device,
wherein:
the illumination device is configured to illuminate an object;
the projection device is configured to project an image of the object onto an image device; and
at least one member selected from the group consisting of the illumination device and the projection device comprises an arrangement according to claim 1.

4. The arrangement of claim 1, wherein:
the first holding unit comprises first and second clamping elements;
the first and second clamping elements are braced with respect to each other to establish the clamping connection; and
an interface portion of the optical element is clamped between the first and second clamping elements.

5. The arrangement of claim 4, further comprising a tensioning element, wherein the tensioning element acts on both the first and second clamping elements so that the first and second clamping elements are braced with respect to each other to establish the clamping connection.

6. The arrangement of claim 5, wherein the tensioning element extends through a recess in the interface portion.

7. The arrangement of claim 5, wherein the tensioning element comprises a threaded portion into a clamping element selected from the group consisting of the first clamping element and the second clamping element.

8. The arrangement of claim 7, wherein the first clamping element is connected to the base element via the leaf spring.

9. The arrangement of claim 4, wherein the first clamping element is connected to the base element via the leaf spring.

10. The arrangement of claim 9, wherein the second clamping element is connected to the base element via a connection portion.

11. The arrangement of claim 10, wherein at least one of the following holds:
the leaf spring and the connection portion extend substantially parallel to one another;
the leaf spring and the connection portion are mutually spaced in the radial direction;
the leaf spring and the connection portion are at least substantially mutually aligned in the radial direction; and
the leaf spring and the connection portion define a parallel guide configured to guide the first and second clamping elements, which are braced with respect to each other, substantially parallel to the radial direction.

12. The arrangement of claim 1, wherein:
the optical element comprises an interface portion;
at least one of the following holds:
the first holding unit comprises first and second clamping elements, and the interface portion is clamped between the first and second clamping elements; and
the at least three holding units comprise a second holding unit, and the interface portion is combinable with the first holding unit but not with the second holding unit.

13. The arrangement of claim 12, wherein:
the interface portion is defined by a projection of the optical element; and
at least one of the following holds:
a plurality of the interface portions of the optical element are defined at a common projection of the optical element;
all interface portions of the optical element are defined at a ring-shaped projection of the optical element;
the projection extends in the circumferential direction; and
the project extends in a direction which is perpendicular to a plane defined by the circumferential direction and the radial direction.

14. The arrangement of claim 12, wherein:
the respective interface portion comprises an interface element connected to the optical element; and
at least one of the following holds:
the interface element is in a recess of the optical element;
the interface element comprises a connector bushing.

15. The arrangement of claim 14, wherein at least one of the following holds:
the optical element comprises at least one material selected from the group consisting of a ceramic material, Zerodur; and
the interface element comprises at least one material selected from the group consisting of invar, stainless steel and molybdenum.

16. The arrangement of claim 1, wherein:
the optical surface comprises a reflecting optical surface supported by a main body of the optical element;
the main body comprises a projection on a side facing away from the optical surface; and
the projection defines an interface portion to at least one of the holding units.

17. The arrangement of claim 1, wherein at least one of the following holds:
the base element is ring-shaped;
the base element defines a plane of main extension of the base element, and at least one of the holding units projects from the base element substantially perpendicular to the plane of main extension of the base element; and
the base element is monolithic with at least one of the holding units.

18. The arrangement of claim 1, wherein at least one of the following holds:
the arrangement comprises at least six holding units; and
the holding units are substantially uniformly distributed along the circumferential direction.

19. A method of holding an optical element comprising an optical surface, the method comprising:
using a holding device to hold an optical element, the optical element comprising an optical surface,
wherein:
the optical element defines a plane of main extension, a radial direction in the plane of main extension, and a circumferential direction in the plane of main extension;
the optical element is held with respect to a base element of the holding device via more than three separate holding units of the holding device;
the holding units are spaced from each other along the circumferential direction;
for each holding unit:
the holding unit establishes a clamping connection between the optical element and the base element; and
the clamping connection is separate from the clamping connections of the other holding units;
the more than three separate holding units comprise a first holding unit; and
a leaf spring connects the first holding unit to the base element so that the connection of the first holding unit to the base element is compliant in the radial direction and rigid in a direction perpendicular to the plane of main extension.

20. An arrangement, comprising:
an optical element comprising an optical surface; and
a holding device comprising a base element and more than three separate holding units,
wherein:
the optical element defines a plane of main extension and a circumferential direction;
the holding units are connected to the base element;
the holding units are spaced apart from each other along the circumferential direction;
the holding units hold the optical element with respect to the base element;
for each holding unit:
the holding unit establishes a clamping connection between the optical element and the base element; and
the clamping connection is separate from the clamping connections of other holding units;
at least one of the holding units comprises a tensioning element and first and second clamping elements; and
for each of the at least one of the holding units comprising first and second clamping elements:
the first clamping element is connected to the base element via a first connection portion;

the second clamping element is connected to the base element via a second connection portion separate from the first connection portion;

the tensioning element acts on both the first and second clamping elements so that the first and second clamping elements are braced with respect to each other to establish the clamping connection; and an interface portion of the optical element is clamped between the first clamping element and the second clamping element.

21. A device, comprising:
an illumination device comprising a first optical element group; and
a projection device comprising a second optical element group,
wherein:
the illumination device is configured to illuminate an object;
the projection device is configured to project an image of the object onto an image device; and
at least one member selected from the group consisting of the illumination device and the projection device comprises an arrangement according to claim 20.

22. A method of using a device which comprises an illumination device and a projection device, the method comprising:
using the illumination device to illuminate an object; and
using the projection device to project at least a portion of the illuminated object onto an image device,
wherein:
the illumination device is configured to illuminate an object;
the projection device is configured to project an image of the object onto an image device; and
at least one member selected from the group consisting of the illumination device and the projection device comprises an arrangement according to claim 20.

23. An arrangement, comprising:
an optical element comprising an optical surface; and
a holding device comprising a base element and more than three separate holding units,
wherein:
the optical element defines a plane of main extension and a circumferential direction;
the holding units are connected to the base element;
the holding units are spaced apart from each other along the circumferential direction;
the holding units hold the optical element with respect to the base element;
for each holding unit:
the holding unit establishes a clamping connection between the optical element and the base element; and
the clamping connection is separate from the clamping connections of other holding units;
at least one of the holding units comprises a first clamping unit and second clamping unit separate from the first clamping unit; and
for each of the at least one of the holding units comprising first and second clamping units:
the first clamping unit is connected to the base element at a first location;
the second clamping unit is connected to the base element at a second location which is different from the first location;
the first and second clamping units are braced with respect to each other to establish the clamping connection; and
an interface portion of the optical element is clamped between the first clamping unit and the second clamping unit.

24. A device, comprising:
an illumination device comprising a first optical element group; and
a projection device comprising a second optical element group,
wherein:
the illumination device is configured to illuminate an object;
the projection device is configured to project an image of the object onto an image device; and
at least one member selected from the group consisting of the illumination device and the projection device comprises an arrangement according to claim 23.

25. A method of using a device which comprises an illumination device and a projection device, the method comprising:
using the illumination device to illuminate an object; and
using the projection device to project at least a portion of the illuminated object onto an image device,
wherein:
the illumination device is configured to illuminate an object;
the projection device is configured to project an image of the object onto an image device; and
at least one member selected from the group consisting of the illumination device and the projection device comprises an arrangement according to claim 23.

26. An arrangement, comprising:
an optical element comprising an optical surface;
a holding device comprising a base element and more than three separate holding units, the more than three separate holding units comprise a first holding unit; and
a connection portion connecting the first holding unit to the base element,
wherein:
the optical element defines a plane of main extension, a radial direction in the plane of main extension, and a circumferential direction in the plane of main extension;
the connection portion restricts rotation about an axis defining a rotational degree of freedom so that rotation between the optical element and the base element is restricted in the rotational degree of freedom about the radial direction of the optical element;
the holding units are connected to the base element;
the holding units are spaced apart from each other along the circumferential direction;
the holding units hold the optical element with respect to the base element; and
for each holding unit:
the holding unit establishes a clamping connection between the optical element and the base element; and
the clamping connection is separate from the clamping connections of other holding units.

* * * * *